United States Patent [19]

Chen et al.

[11] Patent Number: 5,411,914
[45] Date of Patent: * May 2, 1995

[54] III-V BASED INTEGRATED CIRCUITS HAVING LOW TEMPERATURE GROWTH BUFFER OR PASSIVATION LAYERS

[75] Inventors: Chang-Lee Chen, Sudbury; Leonard J. Mahoney, East Walpole; Michael J. Manfra, Tewksbury; Frank W. Smith, Waltham; Arthur R. Calawa, Wellesley, all of Mass.

[73] Assignee: Massachusetts Institute of Technology, Cambridge, Mass.

[ * ] Notice: The portion of the term of this patent subsequent to Aug. 28, 2007 has been disclaimed.

[21] Appl. No.: 884,651

[22] Filed: May 15, 1992

Related U.S. Application Data

[63] Continuation-in-part of Ser. No. 313,133, Feb. 17, 1989, Pat. No. 5,168,069, which is a continuation-in-part of Ser. No. 157,806, Feb. 19, 1988, Pat. No. 4,952,527.

[51] Int. Cl.$^6$ ............................................. H01L 21/203
[52] U.S. Cl. ........................................ 437/107; 437/5; 437/912; 437/40
[58] Field of Search ................ 437/5, 96, 107, 912, 437/40

[56] References Cited

U.S. PATENT DOCUMENTS

| | | | |
|---|---|---|---|
| 3,530,298 | 9/1970 | Hubbard et al. | 250/199 |
| 3,716,804 | 2/1973 | Groschwitz | 332/7.51 |
| 3,917,943 | 11/1975 | Auston | 250/211 J |
| 3,923,380 | 12/1975 | Kaisha et al. | 350/160 R |
| 3,942,132 | 3/1976 | Zinn | 331/94.5 H |
| 3,949,224 | 4/1976 | Klingen | 250/216 |
| 3,958,862 | 5/1976 | Victor | 350/160 R |
| 3,962,657 | 6/1976 | Redman et al. | 332/7.51 |
| 4,020,341 | 4/1977 | Javan | 250/211 J |
| 4,218,618 | 8/1980 | Mourou | |
| 4,291,323 | 9/1981 | Bachmann | 357/30 |
| 4,293,956 | 10/1981 | Alstatt | 455/327 |
| 4,301,362 | 11/1981 | Mourou | 250/211 J |
| 4,326,330 | 4/1982 | LePage et al. | 29/571 |
| 4,376,285 | 3/1983 | Leonberger | 357/17 |
| 4,396,833 | 8/1983 | Pan | 250/211 R |
| 4,525,871 | 6/1985 | Foyt et al. | 455/325 |
| 4,713,354 | 12/1987 | Egawa et al. | 437/22 |
| 4,952,527 | 8/1990 | Calawa et al. | 437/107 |
| 5,168,069 | 12/1992 | Smith et al. | 437/5 |

FOREIGN PATENT DOCUMENTS

| | | |
|---|---|---|
| 0022383 | 1/1981 | European Pat. Off. . |
| 0133983 | 7/1984 | European Pat. Off. . |
| 0124256 | 11/1984 | European Pat. Off. . |
| 89/07833 | 8/1989 | WIPO . |
| PCT/US89/-00666 | 9/1989 | WIPO . |

OTHER PUBLICATIONS

Chang et al, "Growth of high quality GaAs Layers Directly on Si" J. Vac. Sci. Technol. B 5 (3), May/Jun. '87 pp. 815–818.

Murotani et al., "Growth temperature dependence in MBE of GaAs", *Journal of Crystal Growth 45*, North–Holland Publishing Company, (1978) pp. 302–308.

(List continued on next page.)

*Primary Examiner*—George Fourson
*Assistant Examiner*—Richard A. Booth
*Attorney, Agent, or Firm*—Hamilton, Brook, Smith & Reynolds

[57] ABSTRACT

A new III-V buffer or passivation material is described which is produced by low temperature growth (LTG) of III-V compounds. The material has unique and desirable properties, particularly for closely spaced, submicron gate length active III-V semiconductor FET devices, such as HEMT's, MESFET's and MISFET's. The LTG material is grown under ambient conditions which incorporate an excess of the more volatile of the III-V species into the grown material. The new material is crystalline, highly resistive, relatively insensitive to light, and can be overgrown with high quality III-V active layers or used as a passivation material to insulate and protect active device structures.

22 Claims, 3 Drawing Sheets

OTHER PUBLICATIONS

Chang-Lee Chen, et al., "High-Breakdown-Voltage MESFET with a Low-Temperature-Grown GaAs Passivation Layer and Overlapping Gate Structure," *IEEE Electron Device Letters*, 13(6):335–337 (Jun., 1992).

Chang-Lee Chen, et al., "High-Power-Density GaAs MISFET's with a Low-Temperature-Grown Expitaxial Layer as the Insulator," *IEEE Electron Device Letters*, 12(6):306–308 (Jun., 1991).

F. W. Smith, et al., "Sidegating Reduction for GaAs Integrated Circuits by Using a New Buffer Layer," *International Electron Devices Meeting* 838–841 (Dec., 1988).

D. C. Look, et al., "Unpinning of GaAs Surface Fermi Level by 200° C. Molecular Beam Epitaxial Layer," *Appl. Phys. Lett.* 57(24), 2570–2572 (10 Dec. 1990).

L.-W. Yin, et al., "Improved Breakdown Voltage in GaAs MESFET's Utilizing Surface Layers of GaAs Grown at a Low Temperature by MBE," *IEEE Electron Device Letters*, 11 (12):561–563, (Dec. 1990).

April S. Brown, et al., "AlInAs–GaInAs HEMT's Utilizing Low-Temperature AlInAs Buffers Grown by MBE," *IEEE Electron Device Letters* 10 (12):pp. 565–567 (Dec., 1989).

"AlAs Diffusion/Schottky Barrier on GaAs," NTIS Tech Notes, p. 823, (Oct., 1990).

"Deep Levels in Molecular–Beam–Epitaxial GaAs", R. A. Stall et al. *Electronics Letters*, vol. 16, No. 5, pp. 171–172, (1980).

"Temperature Range for Growth of Autoexpitaxial GaAs Films by MBB", *Journal of Crystal Growth 43*, North–Holland Publishing Company, pp. 204–208 (1978).

"An Investigation of GaAs Films Grown by MBE at Low Substrate Temperatures and Growth Rates", G. M. Metze et al., *J. Vac. Sci. Technol. B* 1 (2), American Vacuum Society, pp. 166–169 (1983).

"New MBE Buffer for Micron and Quarter–Micron Gate GaAs MESFET" F. W. Smith et al., IEEE Cornell Conference on High Speed Semiconductor Devices-Abstract, Aug. 11, 1987.

"New MBE Buffer Micron and Quarter–Micron Gate GaAs MESFETs", IEEE Cornell Conference on High Speed Semiconductor Devices and Circuits (1987), Piscataway, N.J., p. 229, F. W. Smith et al.

"Monolithic Integration of GaAlAs Injection Laser with a Schottky–Gate Field", F. Fukuzawa, et al., *Appl. Phys. Lett. 36*, American Institute of Physics, pp. 181–183 (1980).

"GaAs Integrated Optoelectronics", Bar-Chaim et al., *IEEE Transactions on Electron Devices*, vol. Ed. 29, No. 9, pp. 1372–1381 (1982).

"Monolithic Two-Dimensional Surface-Emitting Arrays of GaAs2/AIG diode", J. P. Donnelly et al., *Appl. Phys. Lett.* 51 (15), American Institute of Physics, pp. 1138–1140 (1987).

"New MBE Buffer for Micron and Quarter–Micron Gate GaAs MESFETs", F. W. Smith, et al., 1987 *IEEE Device Research on High Speed Semiconductor Devices Abstract*, Jun. 24, 1987.

"New MBE Buffer Used to Eliminate Backgating in GaAs MESFETs", F. W. Smith, et al., *IEEE Electron Device Letters*, EDL–9:77 (1988).

"New MBE Buffer Used to Eliminate Backgating in GaAs MESFETs", F. W. Smith, et al., MIT Lincoln Laboratory Solid State Research, Quarterly Technical Report (Distributed Feb. 23, 1987), pp. 1–10.

"Effects of Very Low Growth Rates of GaAs Grown by Molecular Beam Epitaxy at Low Substrate Temperatures", G. M. Metze, et al., *Appl. Phys. Lett. 42(9), 42:818–820 (1983)*.

"Molecular Beam Epitaxial Growth of InP", J. H. McFee et al., *J. Electrochem. Soc.* 124:259–272 (1977).

"Photoluminescence of $Al_xGa_{1-x}As$ Grown by Molecular Beam Epitaxy", G. Wicks, et al., J. Appl. Phys. 52(9), pp. 5792–5796 (1981).

"Effect of Growth Temperature on the Photoluminescent Spectra From Sn–doped $Ga_{1-x}Al_xAs$ Grown by Molecular Beam Epitaxy", V. Swaminathan, et al., *Appl. Phys. Lett.* 38:347–349 (1981).

"Channel and Substrate Currents in GaAs FETS Due to Ionizing Radiation", R. Zuleeg, et al., *IEEE Transactions on Nuclear Science NS–30:* 4151–5156 (1983).

"The Effects of Transient Radiation on GaAs Schottky Diode FET Logic Circuit", E. R. Walton et al., *IEEE Transactions on Nucl. Science NS–30:* 4178–4182 (1983).

Maezawa et al. IEEE Electron Device Lett., EDL7, 454 (1986), "Large Transconductance n+–ge Gate AlGaAs/GaAs MESFET with Thin Gate Insulator".

Casey and Cho, "Insulating Layers by MBE: in the Technology and Physics of Molecular Beam Epitaxy", E. H. C. Parker (ed.), Plenum Press, N.Y., 1985 Chapter 13, pp. 413–423, Insulating Layers by MBE.

Naganuma and Takahashi, *Phys. Stat. Sol. (a)31:187 (1975), "GaAs, GaP and $GaAs_{1-x}P_x$ Films Deposited by Molecular Beam Epitaxy"*.

Weisbuch et al., *Inst. Phys. Conf.* Ser. No. 56, pp. 711–720 (1981) "Optical Properties and Interface Disorder of $GaAs-Al_xGa_{1-x}As$ Multi–Quantum Well Structures".

"Summary Abstract: Protection of an Interrupted Molecular–Beam–Epitaxially Grown Surface by a Thin Epitaxial Layer of InAs", Chang et al., *J. Vac. Sci. Technol. B3(2),* Mar./Apr. 1985, pp. 518–519.

"New MBE Buffer Used to Eliminate Backgating in GaAs MESFET's", Smith et al., *IEEE Electron Device Letters 9,* Feb./1988, No. 2. pp. 77–80.

"Proceedings of the 14th Annual Conference on the Physics and Chemistry of Semiconductor Interfaces", *Journal of Applied Physics 57,* Mar./1985 No. 6, pp. 1922–1927.

"Effect of Arsenic Partial Pressure on Capless Anneal of Ion–Implanted GaAs", Kasahara et al., *J. of the Electrochem Society,* vol. 126 (1979 No. 11, pp. 1997–2001.

"Low–Temperature Growth of GaAs and AlAs–GaAs (List continued on next page.)

OTHER PUBLICATIONS

Quantum-Well Layers by Modified Molecular Beam Epitaxy", Horikoshi et al., Japanese Journal of Applied Physics 25 (1986) Oct. No. 10, part 2, pp. L868–L870.

"Gain and Bandwidth of Fast Near-Infrared Photodetectors: A Comparison of Diodes, Phototransistors, and Photoconductive Devices", IEEE Transactions on Electron Devices, vol. Ed–29, No. 9, Sep. 1982, pp. 1420–1431, Beneking.

"Microwave Switching Performance of High-Speed Optoelectronic Switches", IEEE Proceedings-I, vol. 128, No. 6, Dec. 1981, pp. 193–196, Platte, W.

"Carrier Relaxation Mechanisms in $CdS_{0.5}Se_{0.5}$ Optoelectronic Switches", Journal of Applied Physics, vol. 51, No. 9, Sec. 1980, pp. 4889–4893, Mathur et al.

"High Speed InP Optoelectronic Switch", Leonberger et al., *Appl. Phys. Lett.* 35(9), Nov. 1, 1979, pp. 712–714.

"GaAs Infrared Source for Optoelectronic Applications", 1963, International Solid–State Ckts Con. pp. 108–109, Baird et al.

"Isolation of Junction Devices in GaAs Using Proton Bombardment", Foyt et al., Solid-Stte Electronics, 1969, vol. 12, pp. 209–214.

Stanley et al., "MBE of InP and other P-containing Compounds", The Physics and Technology of Molecular Beam Epitaxy, E. H. C. Parker (ed.), Plenum Press, N.Y. (1985), pp. 275–311.

III-V BASED INTEGRATED CIRCUITS HAVING LOW TEMPERATURE GROWTH BUFFER OR PASSIVATION LAYERS

GOVERNMENT RIGHTS

The United States Government has rights in this invention pursuant to U.S. Air Force Contract No. F19628-90-C-0002.

RELATED APPLICATIONS

This application is a continuation-in-part of U.S. patent application Ser. No. 07/313,133, filed Feb. 17, 1989, now U.S. Pat. No. 5,168,069 issued Dec. 1, 1992 which is a continuation-in-part of U.S. patent application Ser. No. 07/157,806, filed Feb. 19, 1988 (now U.S. Pat. No. 4,952,527 issued Aug. 28, 1990).

BACKGROUND ART

Semiconductor compounds of the III-V materials and alloys thereof; such as the compounds gallium arsenide (GaAs) and indium phosphide (InP) and the alloy aluminum gallium arsenide (AlGaAs) have unusual optoelectronic properties which make them attractive for many applications; ranging from microwave devices to optoelectronic devices. Among these applications is the use of such materials to make devices for high-speed logic integrated circuits and for microwave integrated circuits. The Schottky-barrier gate metal-semiconductor-field-effect transistor (MESFET) is a typical device used in these integrated logic circuits.

The MESFET is a three terminal device consisting of a source, gate and drain. The source and drain terminals form low resistance contacts to a channel whose conduction is controlled by the depletion field of a Schottky-barrier gate. The conducting channel, which is placed on a semi-insulating (SI) substrate, may be formed either by ion implantation into the semi-insulating material, or by epitaxially growing the active layer on semi-insulating material.

A number of problems associate with MESFET devices and circuits are attributed to the SI substrate. Such problems include backgating (or sidegating), hysteresis in the dependence of the drain-source current $I_{ds}$ upon drain-source voltage $V_{ds}$, light sensitivity, low output resistance $R_d$, low source-drain breakdown voltage $BV_{SD}$, and low output power gain at RF frequencies. Among these problems, backgating is the most significant for both digital and analog circuit applications.

In addition to these problems, increased subthreshold leakage current, threshold voltage shifts, and the inability to fully pinch-off the device for large $V_{ds}$ can occur as the gate length of MESFET's is reduced to submicron dimensions. Also, $R_d$ and $BV_{SD}$ are further decreased as the gate length is reduced. These problems are called short-channel effects and the characteristics of the layer underlying the active region can have a profound influence on them.

Backgating or sidegating is the change of $I_{ds}$ in a MESFET as a result of a voltage applied to the substrate or an adjacent, and nominally isolated, contact pad (sidegate). Even though the sidegate and MESFET may be physically separated, as by mesa etching, the interaction may still arise because the substrate is of finite resistivity and charge can accumulate at the interface between the active layer and the substrate. In response to changes in voltage on the substrate or adjacent devices, the substrate conducts enough current to modulate the interface space-charge region. When this interfacial depletion region widens into the active channel, the device current is reduced.

A buffer layer is often inserted between the active layer and the substrate to alleviate the problem of backgating. To reduce backgating and other substrate related effects, the buffer layer should provide an increase in bulk resistivity. A number of possible buffer layers have been suggested, including undoped GaAs, AlGaAs, and superlattice (GaAs/AlGaAs) buffers. Heretofore such buffer layers have met with only limited success.

Another device useful for high-speed circuits is the MISFET (metal-insulator-semiconductor-field-effect-transistor). This, like the MESFET is a three terminal device. In the MISFET an insulator layer is formed between the underlying active channel region and the gate. In III-V devices it has been difficult to develop an insulator which meets all the requirements for such a layer.

DISCLOSURE OF THE INVENTION

The invention comprises a layer of III-V material, or an alloy thereof, and a process for growing such a layer on a substrate by molecular beam epitaxy (MBE) at low substrate temperatures. The low-temperature-grown (LTG) layer thus grown is optically inert or inactive, that is, the electrical conductivity of the material is relatively insensitive to light and the material is substantially non-luminescent. Furthermore, the layer is electrically insulating. The layer is especially useful as a buffer layer for growth of III-V MESFET's, MOSFETs or MISFETs thereon or as an insulator layer for MISFETs and as a passivation layer for MESFETs or other FETs.

After the LTG layer is grown to a suitable thickness, the outer surface is reconstructed and stabilized to enable good quality crystal growth of subsequent layers. Reconstruction is achieved by annealing in an ambient containing the more volatile of the III-V species, i.e., for GaAs the ambient is As; for InP the ambient is P. The function of stabilization is to prevent or minimize out-diffusion of the more volatile specie from the low temperature buffer layer. This may be achieved by providing a careful choice of initial regrowth temperature, to produce a buffer stabilizing layer over the low temperature buffer layer. Alternatively, a buffer stabilizing layer of material, which is capable of preventing out-diffusion, may be grown over the LTG layer.

BEST MODE OF CARRYING OUT THE INVENTION

I. GaAs MESFET EMBODIMENT

Figure 1:
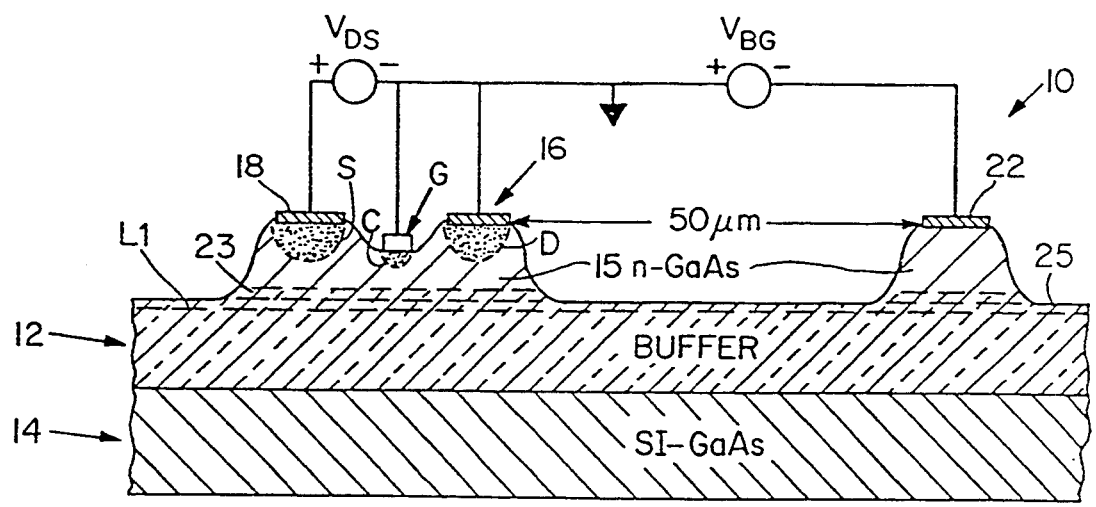
FIG. 1 is a schematic cross-section of GaAs MESFET and backgate terminal formed on a buffer layer of the invention.

Referring now to FIG. 1, the invention will be described in detail in connection therewith. It should be understood that while the device of FIG. 1 is a GaAs MESFET structure, other devices and other III-V materials are contemplated as being within the scope of the invention. FIG. 1 is a schematic cross-section of a GaAs MESFET structure 10 made in accordance with the invention to include a new buffer layer 12 and buffer stabilizing layer 23.

Note: While the term "layer" is used to define the films formed on substrates, it is intended that this term also covers films disposed in regions of the substrate other than the entire substrate surface.

Buffer layer 12 is formed by MBE on a SI-GaAs substrate using Ga and $As_4$ beam fluxes, under arsenic stable growth conditions, at optimal substrate temperatures between 150° to 250° C., and at growth rates of 1 micron/hour.

The range of 150°–250° C. is believed to be an optimal growth temperature range to produce the buffer layer 12. However, temperatures below 300° C. are contemplated as being suitable for buffer layer growth. These growth temperatures are substantially lower than those used in previous studies of GaAs grown by MBE at a low substrate temperatures ["Growth-Parameter Dependence of Deep Levels in Molecular-Beam-Epitaxial GaAs", Stall et al., *Electronics Letters*, (1980) 171–172; "Growth Temperature Dependence in Molecular Beam Epitaxy of Gallium Arsenide", Murotani et al., *Journal of Crystal Growth* 45 (1978) 302–308; "Temperature Range for Growth of Autoepitaxial GaAs Films by MBE", Neave et al., *Journal of Crystal Growth* 43 (1978) 204–208; "An Investigation of GaAs Films Grown by MBE at Low Substrate Temperatures and Growth Rates", Metze et al., *J. Vac. Sci. Technol.* B1(2), (1980) 166–169].

The reflected high energy electron diffraction (RHEED) pattern observed during growth, for substrate temperatures as low as 200° C., indicates that the buffer is crystalline. This result has been confirmed by double-crystal x-ray diffraction. The buffer layer resistivity increases with decreasing growth temperature, but below 200° C. it has not sufficient thickness. All the data presented here are for buffers grown at 200° C. The resistivity of the buffer layers grown is $10^7$ ohm-cm. The exact resistivity could not be determined using conventional Hall-effect measurement techniques, because the resistivity exceeds the measuring capability of our equipment. The material is non-stoichiometric GaAs having an excess of about 1% As, as determined by Auger Electron Spectroscopy.

After a buffer layer 12 of about 2 microns is grown as described above, on an SI-GaAs substrate, the structure is brought to a temperature of between about 480° and 580° C. and heat treated in an arsenic ambient at that temperature for about 10 minutes to reconstruct the exposed surface 25 of layer 12 to a short depth illustrated by the dotted line L1. Next, a thin (30–200Å) buffer stabilizing layer 23 of GaAs is deposited by MBE at a relatively low growth temperature of 550° C. or less. The heat treatment appears to alleviate surface crystalline defects and the stabilizing layer 23. As an alternative to regrowth of the GaAs, other materials capable of preventing out-diffusion, but having appropriate lattice matching feature for growth of active layer thereon, may be used, such as, Al, AlGaAs, or a thin GaAs/AlGaAs superlattice.

An 0.3 micron thick n-doped GaAs layer is then grown by MBE on layer 23 at typical MBE GaAs growth temperature of 600° C. MESFET's 16 were then fabricated on the doped GaAs layer by conventional etching and metallization processes.

For experimental purposes, in order to demonstrate backgating performance, a sidegate 22 was formed adjacent to MESFET 16 and mesa-isolated by etching up to, or into, the top surface 25 of buffer layer 12.

MESFET 16 consists of an n+ source region S and an n+drain region D, laterally separated by an n-channel region C formed beneath a (Schottky) metal gate electrode G. Ohmic contacts 18 of Ni/Ge/Au or Pd/Ge/Au are formed on the source and drain regions. The gate electrode G is formed of Ti/Au.

The measured gate length, gate width, and source-drain spacing of this experimental device are 2, 98, and 5.5 microns, respectively. An ohmic contact 22, isolated from the MESFET 16 by mesa etching, served as the sidegate. For comparative purposes, MESFET's, as described above, were fabricated in MBE n-GaAs layers grown upon the buffer stabilizing layer 23 of the invention and also upon buffer layers of undoped GaAs, AlGaAs, and GaAs/AlGaAs superlattices. All the buffer layers were grown by MBE and were 2 microns thick. In each case, the active layer 15 was doped to approximately $2 \times 10^{17}$ cm$^{-3}$ with silicon and was 0.3 microns thick. MESFET's were also fabricated in commercial vapor phase epitaxy (VPE) n-GaAs layers deposited on semi-insulating GaAs substrates and on layers made by direct ion implantation into the SI GaAS substrates. The gate recess depth is roughly half the active layer thickness, and mesa etching was used to isolate the devices.

Figure 2:
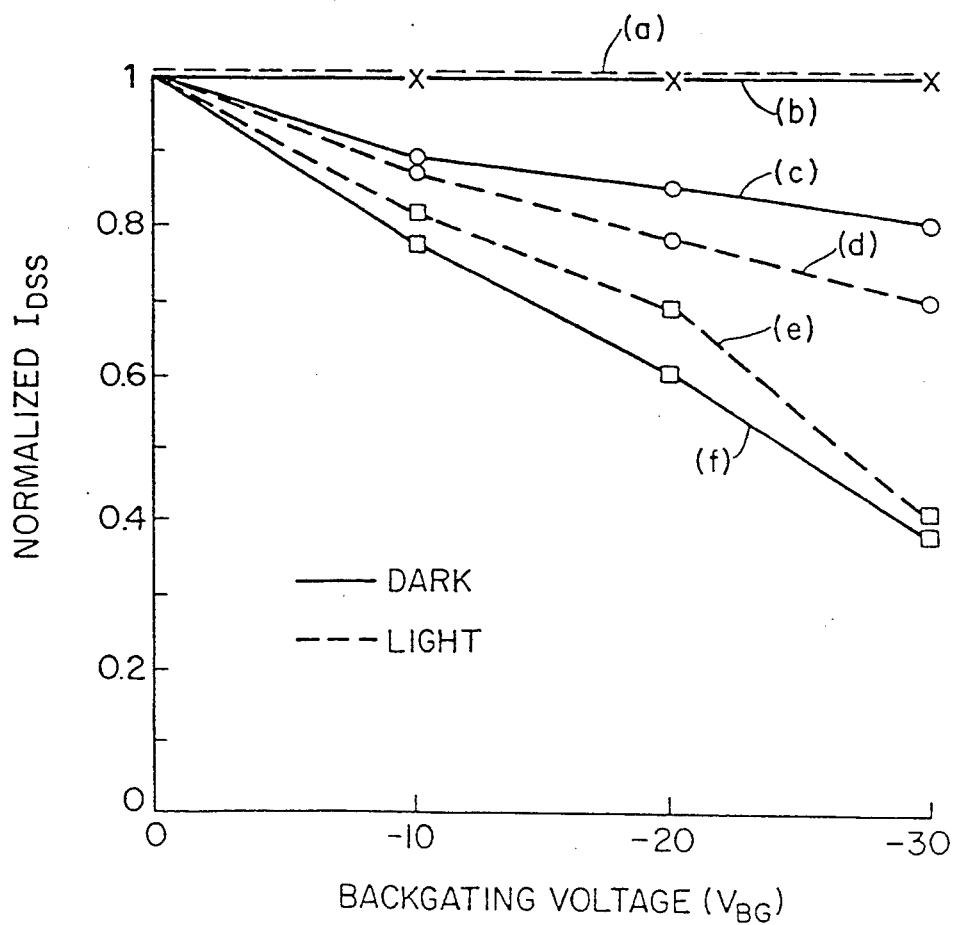
FIG. 2 is a plot of normalized saturated drain source current ($I_{DSS}$) versus backgating voltage for GaAs MESFET's fabricated in accordance with the invention (curves a and b) and GaAs MESFET's fabricated using prior art techniques (curves c-f).

The most dramatic improvement in device performance provided by the new buffer layer is the elimination of backgating, as illustrated by FIG. 2. FIG. 2 is a plot of normalized $I_{dss}$ [$I_{dss}(V_{BG})/I_{dss}(O)$] plotted versus applied backgating voltage $V_{BG}$. A sidegate 22 spaced 50 microns from the MESFET 16 and a drain to source voltage of 2.5 V are used. Data obtained both in the dark (solid line) and in white light (dotted line) are shown. The lines in the figure are included only as a convenience in visualizing the data.

The data in FIG. 2 provides a comparison between backgating in MESFET's fabricated in active layers on the new buffer 12 (curves a and b) with backgating in MESFET's fabricated in active layers on an undoped GaAs buffer (curves e and f) and on an undoped GaAs/$Al_{0.45}Ga_{0.55}As$ superlattice buffer grown by MBE at 700° C. (curves c and d). Both GaAs and superlattice buffered devices show backgating and light sensitivity, while the device with the new buffer shows neither. Although not shown here, MESFET's fabricated using all of the other buffers show light sensitivity and backgating. Of the alternative buffers, the AlGaAs and superlattice buffers grown at 700° C. appear to be the best.

Although the data presented in FIG. 2 were measured using a sidegate spaced 50 microns from the MESFET 16, a sidegate spaced 15 microns from the MESFET was also used. For −50 V applied to the sidegate and $V_{ds}=2.5$ V, the new buffered device still showed no backgating. For the same voltages, $I_{dss}$ of the superlattice buffered MESFET was reduced by 50% and the GaAs buffered devices destructively broke down.

Although grown from Ga and As beam fluxes, the new buffer 12 differs markedly from GaAs grown at normal growth temperatures of approximately 600° C. In addition to its larger resistivity, the grown surface is not reconstructed, as indicated by the photoluminescence (PL) spectrum. However, doped layers of GaAs grown by MBE upon the buffer stabilizing layer 23 are of comparable optical and electrical quality to similar layers grown upon conventional undoped GaAs buffers grown by MBE at 580° C. The PL spectra for the doped films on the new buffer capped by stabilizing layer 23 are essentially identical to those for the doped films on the conventional undoped GaAs buffer.

The new low temperature buffer layer 12 is capable of substantially eliminating radiation transient effects in III-V integrated circuits. The mechanism of transient radiation related failure in III-V circuits is believed to be caused by diffusion of hole-electron pairs that have been generated in the bulk of the III-V substrate by the radiation, into the active region of the devices fabricated on the surface of the substrate. Because of the optoelectronic inertness and insulating characteristics of the new III-V buffer layer, it should eliminate the undesirable effects of radiation on circuit performance. Not only should the buffer itself not be susceptible to the radiation, but the charge carriers generated in the semi-insulating III-V substrate should be blocked from entering the active region of the device by the presence of the intervening buffer layer.

Recent measurements of the GaAs MESFET devices incorporating the new MBE low temperature buffer layer indicate that the new MBE low temperature buffer layer does, indeed, substantially reduce the sensitivity of MESFET devices to pulsed ionizing radiation. Transient radiation measurements were made on a MESFET device with an undoped GaAs buffer layer and on a MESFET device with the new MBE buffer layer. The MESFET with the new MBE low temperature buffer layer showed an overall several order of magnitude reduction in sensitivity to pulsed ionizing radiation as compared with the MESFET with the undoped GaAs buffer layer.

II. GaAs ON Si HIGH ELECTRON MOBILITY TRANSISTOR (HEMT) EMBODIMENT

Figure 3:
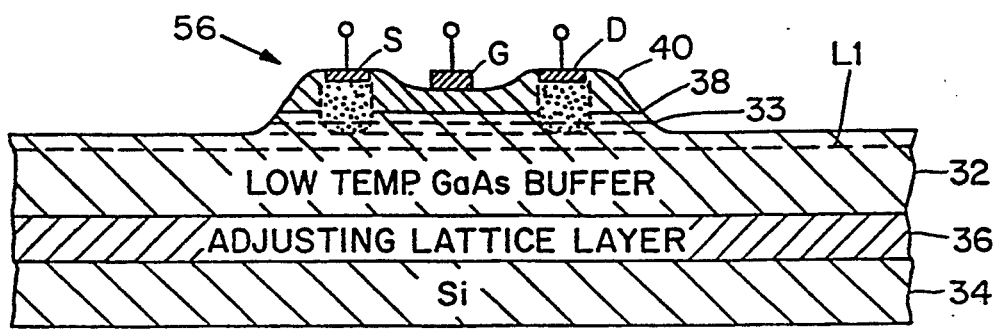
FIG. 3 is a schematic cross-section of an alternate embodiment of the invention in which a GaAs device is formed on a buffer layer of the invention, which layer is formed over a silicon substrate.

FIG. 3 is a cross-sectional view of an alternate embodiment of the invention, wherein a HEMT device 56 is formed on the buffer stabilization layer 33.

Layer 33, the buffer stabilizing layer, is formed by MBE, as in the FIG. 1 embodiment, on a low temperature MBE GaAs buffer 32. Unlike FIG. 1, the GaAs buffer 32 is formed over a silicon (Si) substrate 34, with an adjusting lattice layer of GaAs 36 sandwiched between to serve as a growth stabilizing layer. The use of the Si substrate has the advantage that Si devices may be formed on laterally adjacent isolated regions of the surface of substrate 34 and conductively coupled by suitable metallization to the GaAs HEMT device 56, thus providing a GaAs/Si monolithic integrated structure, wherein the electro-optical properties of the GaAs material may be conveniently combined with the electronic properties of the Si material. A suitable isolation technique is proton bombardment of the active layers 38 and 40 down to the stabilizing or buffer layers 33 and 32 laterally adjacent the device 56 to convert the volume bombarded to semi-insulating material. Alternatively, mesa etching, as in FIG. 3, can be used for isolation.

After LTG GaAs buffer layer 32 is formed, the upper surface is reconstructed and a stabilizing layer 33 is formed, as previously described. Next, a GaAs/AlGaAs HEMT device is formed on the stabilizing layer by MBE deposition of an undoped low bandgap GaAs layer 38, followed by MBE deposition of an n+ modulation doped higher bandgap AlGaAs layer 40. At the interface between the two layers 38 and 40, a two dimensional electron gas is formed, which contributes to the high electron mobility of the HEMT device (See "Gallium Arsenide Technology", Howard W. Sams & Co. 1985, Chapter 4, pp 107–153 for a more detailed discussion of HEMT's). Suitable ohmic drain D and source S contacts are evaporated onto the AlGaAs layer 40 with a Schottky-barrier type electrode G being formed between the two in the well-known manner. It should be noted that while the GaAs HEMT device 56 is shown for illustrative purposes in FIG. 3, any III-V compound device which can be grown on GaAs is intended to be included in this embodiment. One example is a pseudomorphic InGaAs/AlGaAs HEMT.

III. OPTOELECTRONIC DEVICE

Figure 4:
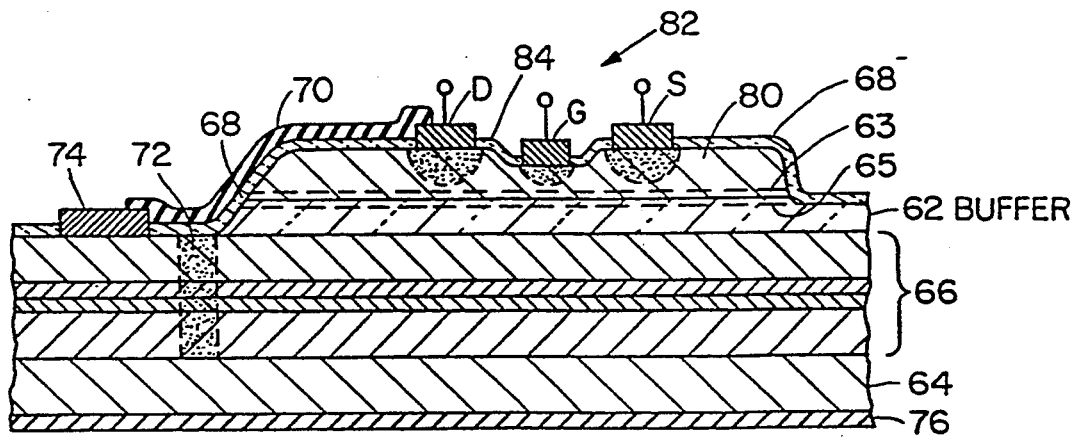
FIG. 4 is a schematic cross-section of another embodiment of the invention in which an optical device and an electronic device are monolithically combined using the buffer layer of the invention for vertical optoelectronic isolation.

The essentially zero electrical conductivity, and the largely optically inert properties of the new low temperature buffer material, may be advantageously utilized in the formation of an integrated optoelectronic circuit. Such a circuit will now be described in connection with FIG. 4. In the embodiment of FIG. 4, a GaAs/AlGaAs double heterostructure epitaxial laser region 66 is formed by conventional techniques, i.e., liquid phase epitaxy (LPE) or MBE, on a GaAs substrate 64. A low temperature buffer layer 62, with a reconstructed surface 65 and a buffer stabilizing layer 63, is then formed as in the previously described embodiments. This optically inert/non-conductive buffer serves as a vertical isolation layer. Next, an n-GaAs FET layer 80 is formed on the stabilizing layer 63.

In the region where the laser is formed, the layers 80, 63, 65, and 62 are removed, as by etching, and proton bombardment applied to the underlying structure, to form a lateral isolation region 72. An insulating layer 68 of, for example, SiO₂, or polyimide, is then formed over the top surface. The layer 68 is etched away in regions where the laser contact 74 and drain D and source S contacts for the MESFET 82 are to be formed.

Appropriate metallization/doping is applied to the regions of the openings to form the contacts and further openings in the oxide 68 are formed and the FET layer 80 recessed. Gate contact G is formed through an additional insulating mask region 84. Metallization 70 is applied over layer 68 to interconnect MESFET 82 to laser contact 74. A suitable contact 76 is then formed on substrate 64. (See T. Fukuzawa, et al., "Monolithic Integration of GaAlAS Injection Laser with a Schottky-gate Field Effect Transistor" *Appl. Phy. Lett.* Vol 36, pp. 181–183 (1980) and N. Baz-Chaim, , et al., "GaAs Integrated Optoelectronics" *IEEE Trans. on Electron. Devices*, Vol. ED-29, pp. 1372–1381, 1982 for a description of conventional process steps for MESFET and laser integration.)

The laser may be optionally formed as a two dimensional array of surface-emitting diode lasers, as described in J. P. Donnelly, et al., "Monolithic Two-Dimensional Surface-Emitting Arrays of GaAs/AlGaAs Diode Lasers" *Appl. Phys. Lett.*, Vol 51, pp 1138–1140, 1987.

IV. MISFET DEVICE

Figure 5:
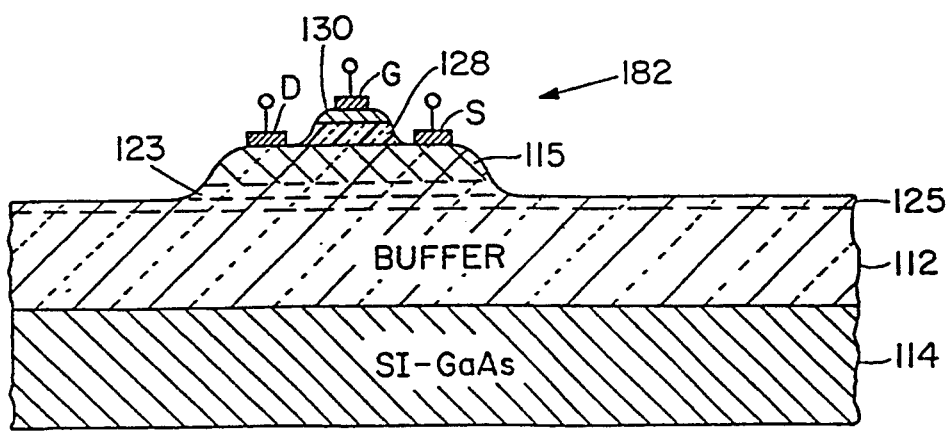
FIG. 5 is a schematic cross-section of a metal-insulator-semiconductor-field-effect-transistor (MISFET) embodiment of the invention in which an LTG layer forms the insulator layer for the gate of a MISFET device.

The ability to fabricate silicon MOSFET devices (metal-oxide-semiconductor-field-effect-transistors) has made possible NMOS and CMOS very large scale integration (VLSI) technology, the workhorses of today's computers and electronics. Heretofore, GaAs MOSFET or MISFET (metal-insulator-semiconductor-field-effect-transistors) devices have not been possible, because the oxide or insulator pins the GaAs Fermi level at the surface due to a large density of interface states. Considerable effort has been undertaken to develop an insulating layer that does not pin the GaAs Fermi level at the surface. To date, these efforts have not met with commercial success. In the embodiment of FIG. 5, a GaAs MISFET is shown which has a number of advantages relative to GaAs MESFET's. Some of these advantages relative to GaAs MESFET's are: reduced gate current, more uniform and larger threshold voltage, larger logic voltage swings, and the possibility of making complementary III-V MISFET integrated circuits.

We have fabricated n-channel depletion-mode GaAs MISFET's and MIS capacitors using the new low temperature buffer as the gate insulator. A GaAs MISFET structure is illustrated in FIG. 5. The substrate 114, buffer 112, annealed region of the buffer 125, stabilization layer 123, and the active FET layer 115, are the same as for the MESFET of FIG. 1, previously described. On top of the active layer 115, a thin layer 128 of the low temperature buffer (50–1000Å) is formed, as previously described, with an annealed restructured region and stabilizing layer (not shown). A GaAs gate layer 130 (50–250Å thick) is then deposited by MBE over the gate buffer layer 128. The gate metal G is deposited on the upper GaAs gate layer 130. Regions of the upper GaAs layer 130 and the upper buffer layer 128 are removed laterally adjacent the gate region and ohmic contacts D and S, for the drain and source, respectively, are fabricated in these regions on the active FET layer 115. Either Mesa isolation, or proton bombardment, is used to isolate the individual devices 182.

MISFET I-V (current-voltage) characteristics of an experimental device, fabricated as above, show that the channel region beneath gate G can be fully pinched-off and the MIS C-V (capacitance-voltage) characteristics show a low interface state density. This device has not yet been optimized, although the preliminary results are encouraging. Alternative layers to the top thin GaAs gate layer 130 include thin layers of AlGaAs, thin insulating layers, such as silicon dioxide or silicon nitride, or thin composite layers of these materials. The MISFET depicted in FIG. 5 is an n-channel, depletion mode device. It is expected that n-channel and p-channel depletion, enhancement, and inversion mode GaAs MISFET devices may be possible using the new low temperature buffer layer as the gate insulator.

V. MESFET WITH OVERLAPPING MIS GATE STRUCTURE

Figure 6:
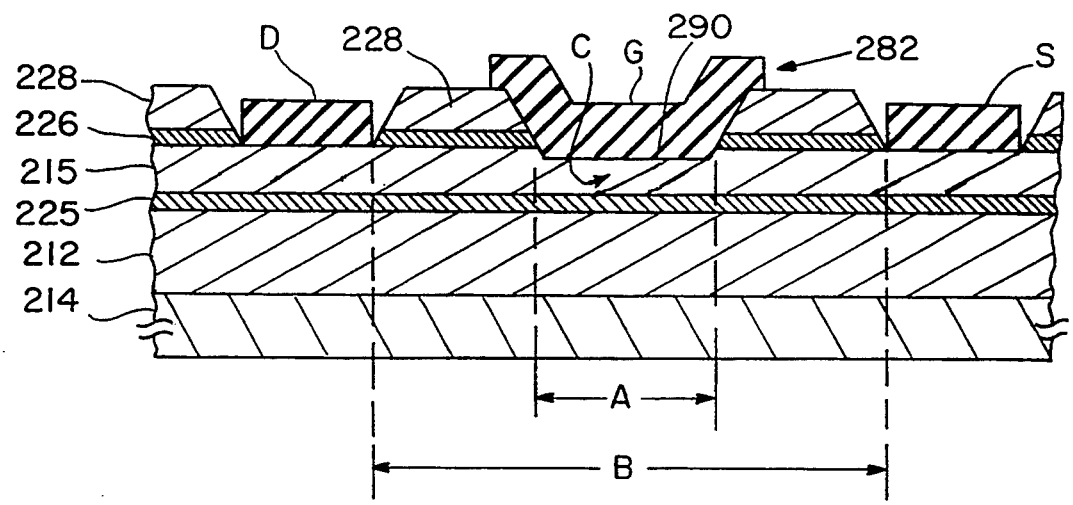
FIG. 6 is a schematic cross-section of an alternate embodiment of the invention in which the source and drain edges of the metal gate of a III-V MESFET overlap a LTG insulation layer.

Since the highest field occurs at the drain side of the gate edge of a MESFET, it is possible that a high gate-breakdown voltage can still be achieved even if an MIS structure is formed only at the edge of the MESFET gate as shown in FIG. 6. The GaAs MESFET 282 of FIG. 6 with an overlapping-gate structure has a breakdown voltage substantially higher than that of a conventional MESFET. The bottom of the Schottky-barrier gate G contacts the channel region 290 as in a conventional MESFET, but both gate edges rest on LTG GaAs insulation or passivation layer 228. This structure has the advantage that parameters such as drain current and transconductance $g_m$ are not adversely affected, and, in addition, it can be applied to other devices such as the high-electron-mobility transistor (HEMT) of FIG. 3.

As shown in the schematic cross-section of FIG. 6 epitaxial layers, similar to those used for the LTG GaAs MISFET of FIG. 5, were grown by molecular beam epitaxy on a semi-insulating GaAs substrate 214. The layers consist of a 2000-Å-thick LTG GaAs buffer layer 212, a 100-Å-thick AlAs stabilizing layer 225, a 1000-Å-thick GaAs active layer 215 doped with Si to $4 \times 10^{17}$ cm$^{-3}$, a 100-Å-thick AlAs stabilizing layer 226, and a 2000Å-thick LTG GaAs layer 228. The growth temperature was 190° C. for the LTG GaAs layers and 580° C. for all other layers.

For comparison purposes, conventional-gate and overlapping-gate MESFET's were fabricated on respective wafers having this layer structure. Ohmic contacts D, G and S were formed by first etching through the top LTG GaAs and AlAs layers 228 and 226 and then depositing Ni/Ge/Au contact pads D, G and S directly on the conducting-GaAs layer 215.

On the wafer used for the MESFET with a conventional gate structure (not shown), the gate area was first defined by photoresist. The LTG GaAs and AlAs layers were then etched away in the gate opening and the conducting GaAs channel was recessed to obtain a drain saturation current $I_{dss}$ of 200 ma/mm of gate width. Next, Ti/Au was evaporated and the gate was formed by a liftoff of the photoresist pattern.

On the wafer used for the overlapping-gate structure of FIG. 6, the same gate mask as used above was used to define an opening for the removal of the LTG GaAs and AlAS layers and for the channel-recess etch (again to an $I_{dss}$ value of 200 ma/mm). This resist layer was removed after etching. A wider gate opening that overlaps the gate-recess region and the LTG GaAs top layer 228 near the edges of the recess region was defined for the gate liftoff using a second layer of photoresist. The gate-recess length (A), drain-source spacing (B), and gate width (length of device perpendicular to plane shown) were 1.5, 6, and 250 μm, respectively. Proton implantation was used for device isolation. The width of the gate overlap is less than 0.3 μm on either side of the gate recess, although in principle, this overlap preferably can be considerably smaller. In one area on this wafer, the LTG GaAs layer 228 and the AlAs layers 226 in the gate region were not etched, allowing MISFET's similar to those described in FIG. 5 to be fabricated on the same wafer with the overlapping-gate MESFET's.

Figure 7:
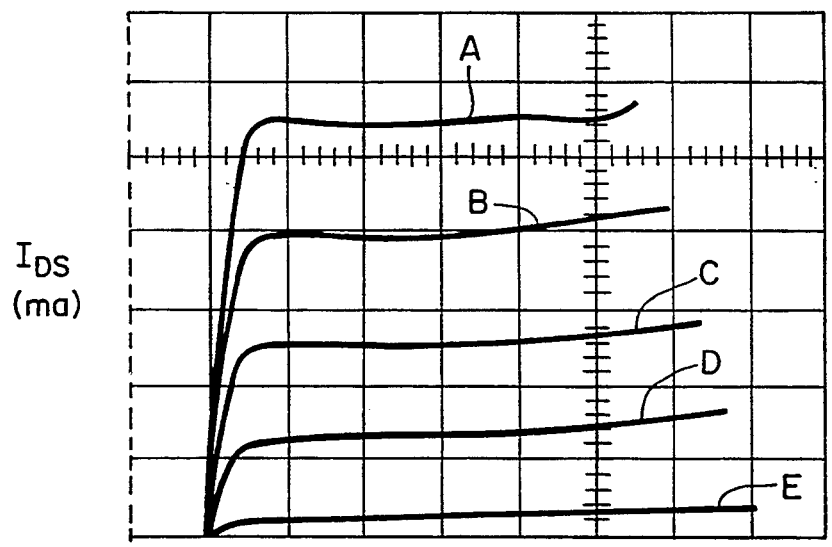
FIG. 7 is a plot of drain-source current ($I_{ds}$) versus drain-source voltage ($V_{ds}$) for the device of FIG. 6.

The $I_{ds}$-$V_{ds}$ characteristics of the overlapping-gate MESFET are shown in FIG. 7. Note that curves A–E were taken in the 80 μs pulse mode of the curve tracer to reduce the heat generated by the device. The curves differ in accordance with the applied voltage. Near pinch off, there is no noticeable excessive drain current for $V_{ds}$ as high as 35 V. The $g_m$ values are 120 and 136 mS/mm for the conventional-gate and the overlapping-gate MESFET's of FIG. 6, respectively. The higher $g_m$ for the overlapping-gate MESFET may be due to the differences in gate structure or may be simply due to the difference in series resistance caused by processing-related variations in ohmic contacts and gate-source spacing. The scattering (S) parameters of these MESFET's were measured with $V_{ds}=6$ V and $V_{gs}=0$ V. The unity-current-gain frequency $f_T$ derived from measured S parameters is 4.8 GHz for the overlapping-gate MESFET and 5.3 Ghz for the conventional-gate MESFET, while the values of maximum frequency of oscillation $f_{max}$ are 15.2 and 14.4 Ghz for the overlapping-gate and conventional-gate MESFET's, respectively.

The breakdown voltages for the different devices are listed in Table I below:

TABLE I

| GaAs MISFET | Breakdown Voltages for FET's | | |
|---|---|---|---|
| | LTG-GaAs-PASSIVATED MESFET WITHOUT GATE OVERLAP | LTG-GaAs-PASSIVATED MESFET WITHOUT GATE OVERLAP | LTG |
| GATE-DRAIN BREAKDOWN (V) | 25 | 42 | 45 |
| DRAIN-SOURCE BREAKDOWN (V) | 22 | 35 | 37 |

The gate-drain breakdown voltage, defined at 200 μA/mm gate current, is 25 V for the conventional-gate MESFET and 42 V for the overlapping-gate MESFET. At pinch off, the drain-source breakdown voltage for the conventional-gate and overlapping-gate MESFET's is 22 and 35 V, respectively. In contrast, the breakdown voltages for a standard MESFET fabricated with this same mask set but without an LTG GaAs passivation layer are 10 V for the drain-source breakdown and 15 V for the gate-drain breakdown.

The characteristics of the LTG GaAs MISFET on the second wafer are similar to those reported previously [C. L. Chen, et al., *IEEE Electron Device Lett.*, 12,306 (1991)]. The forward gate turn-on voltage, also defined at 200 μA/mm of gate current, is 4.5 V for the MISFET compared to 0.4 V for the MESFET on the same wafer. The gate-drain breakdown voltage and drain-source breakdown voltage at pinch off for the MISFET are 45 and 37 V, respectively.

The breakdown voltage of the new MESFET of FIG. 6 has been enhanced significantly by the use of overlapping-gate structure. Although the gate has a Schottky contact to the conducting channel, the breakdown voltages are nearly equal to those of the MISFET, in which the entire gate metallization rests on a high-resistivity LTG GaAs layer. It appears that the high-resistivity LTG GaAs layer under the overlapping portion of the gate in the new MESFET has altered the electric field distribution. As a result, the components of the two-dimensional field that are believed to be responsible for the breakdown are significantly reduced by the new structure. It is important for the success of this approach that the material under the edges of the overlapped-gate have a high resistivity and that the Fermi level at the interface between this material and the conducting channel is not pinned by interface-state charge. Both of these criteria are met by the LTG GaAs material of layer 228, whereas dielectric passivants like $SiO_2$ and $Si_3N_4$ generally fail to meet the second condition.

The slightly higher breakdown voltage in the MISFET is due to the added dielectric-breakdown voltage of the LTG GaAs gate-insulator layer itself. The results suggest that the majority of the increase in breakdown voltage observed for LTG GaAs MISFET's can be attributed to just a small portion of the MIS gate structure near the edges.

A substantial increase in the breakdown voltage of a GaAs MESFET has been achieved by using an LTG GaAs surface passivation layer and a metal gate that overlaps the LTG GaAs layer at the edges of the gate. This increase in breakdown voltage was obtained without sacrificing drain current or gain. The breakdown voltage of such a MESFET is approximately equal to that of the LTG GaAs MISFET minus the gate forward turn-on voltage of the MISFET, this latter value being dominated by the dielectric-breakdown voltage of the LTG GaAs gate insulator. The overlapping-gate approach can be applied to any MESFET-like device, such as a HEMT, without interfering with the device active-layer structure. In addition to improving the breakdown voltage, the same LTG GaAs layer could also eliminate the need for further dielectric passivation.

Equivalents

Those skilled in the art may recognize other equivalents to the specific embodiments described herein, which equivalents are intended to be encompassed by the claims attached hereto. For example, other combinations of III-V materials are contemplated for use as low temperature buffer layers, stabilizing layers, and active layers.

The table below lists various combinations of III-V materials in column 1 versus normal or typical MBE substrate growth temperatures in column 2, approximate recommended substrate growth temperatures for the MBE buffer layer in column 3, and approximate recommended substrate growth temperatures for the stabilizing layer in column 4.

TABLE

| 1 | 2 | 3 | 4 |
|---|---|---|---|
| GaAs | 580° C. | 150–300° C. | 300–550° C. |
| GaP | 550° C. | 150–300° C. | 350–500° C. |
| InP | 450° C. | 50–200° C. | 350–450° C. |
| AlGaAs | 680° C. | 150–450° C. | 500–600° C. |
| InGaAs | 500° C. | 50–300° C. | 300–500° C. |

We claim:

1. A method of making an intermediate layer for semiconductor devices comprising the steps of:

a) forming said layer of group III-V material by lattice matched growth of Group III and Group V species on group III-V material at a growth temperature below about 450° C.;

b) subjecting said layer to a heat treatment at a temperature above said growth temperature in an ambient containing the more volatile of said group III-V species to introduce an excess of the more volatile of said specie into said layer; and c) minimizing out diffusion of said more volatile of said group III-V specie from said layer.

2. The method of claim 1 wherein said layer is comprised of crystalline GaAs and the growth temperature is 300° C. or less, and the more volatile species is As.

3. The method of claim 1 wherein said layer is comprised of crystalline GaAs and the growth temperature is in the range of 150°–300° C.

4. The method of claim 1 wherein said layer is comprised of crystalline InP and the growth temperature is in the range of 50°–200° C.

5. The method of claim 1 wherein said layer is comprised of crystalline GaP and the growth temperature is in the range of 150°–300° C.

6. The method of claim 1 wherein said layer is comprised of crystalline AlGaAs and the growth temperature is in the range of 150°–450° C.

7. The method of claim 1 wherein said layer is comprised of crystalline InGaAs and the growth temperature is in the range of 50° C.–300° C.

8. A method of making an active group III-V device on a substrate comprising the steps of:

a) forming an intermediary layer of group III-V material by homoepitaxial growth of group III and group V crystalline electrically insulative materials over said substrate at a growth temperature below 450° C.;

b) subjecting said intermediary layer to a heat treatment at a temperature above the growth temperature in an ambient containing the more volatile of said group III-V materials to provide an excess of the more volatile material in said intermediary layer;

c) forming said active group III-V device on, or over, said intermediary layer.

9. The method of claim 8 wherein the substrate is formed of silicon with an adjusting lattice layer disposed between the intermediary layer and the silicon.

10. The method of claim 8 wherein the group III-V device is an FET.

11. The method of claim 8 wherein the group III-V device is a MESFET.

12. The method of claim 10 wherein the FET comprises a gate, source and drain region and the gate region is insulated from the source and drain region by an additional layer of electrically insulating group III-V material formed as in said steps a) and b).

13. The method of claim 12 wherein the intermediary layer and additional layer is formed of GaAs.

14. The method of claim 2 wherein the As excess is about 1 atomic percent.

15. The method of claim 8 wherein the III-V material is GaAs, the more volatile material is As, and the excess of As is on the order of 1 atomic percent.

16. The method of group forming group III-V transistors in and on group III-V crystalline device layers with reduced back or side gating effects comprising the steps of:

a) forming a resistive crystalline intermediate layer of group III-V material by homoepitaxial growth at a growth temperature below 450° C.;

b) forming an excess of the more volatile of the group III-V materials in said intermediate layer;

c) forming an active group III-V layer over said intermediate layer;

d) forming group III-V transistors in and on said active layer.

17. The method of claim 16 wherein the group III materials consist of one or more of the elements Al, Ga, and In and the group V materials consist of one or more of the elements P, As and Sb.

18. The method of claim 16 wherein the intermediate layer is formed by MBE of a material from the group consisting of AlGaAs, InP, GaP, GaAs, and InGaAs.

19. The method of claim 16 wherein the intermediate layer is formed of InGaAs.

20. A method of forming a field-effect transistor device comprising the steps of:

a) forming a transistor having a gate electrode disposed over a channel region and in contact with an active layer with source and drain electrodes disposed laterally adjacent the gate electrode; and b) forming an electrically insulative region of group III-V material laterally between the gate electrode and the drain and source electrodes, such region being formed by homoepitaxial growth of group III and group V species at a growth temperature below 450° C., followed by heat treatment of the deposited species in an ambient containing the more volatile of said specie to incorporate an excess of said more volatile specie in said group III-V material.

21. The method of claim 20 wherein the gate electrode extends laterally over the insulative region.

22. The method of claim 20 wherein the group III-V material is formed by MBE of material from the group consisting of GaAs, InGaAs, AlGaAs, GaP and InP.

* * * * *

UNITED STATES PATENT AND TRADEMARK OFFICE
CERTIFICATE OF CORRECTION

PATENT NO. : 5,411,914
DATED : May 2, 1995
INVENTOR(S) : Chang-Lee Chen, Leonard J. Mahoney, Michael J. Manfra, Frank W. Smith and Arthur R. Calawa It is certified that error appears in the above-indentified patent and that said Letters Patent is hereby corrected as shown below:

Cover page, Item [63], delete Serial No. "313,133" and insert --312,133--.

Col. 11, line 29, after 50°, delete ".".

Col. 12, line 10, after "of", delete --group--.

Col. 12, line 26, delete "and" and insert --or--.

Signed and Sealed this

Twenty-seventh Day of June, 1995

Attest:

BRUCE LEHMAN

Attesting Officer      Commissioner of Patents and Trademarks